(12) United States Patent
Chan

(10) Patent No.: US 6,537,708 B2
(45) Date of Patent: Mar. 25, 2003

(54) ELECTRICAL CRITICAL DIMENSION MEASUREMENTS ON PHOTOMASKS

(75) Inventor: David Y. Chan, Austin, TX (US)

(73) Assignee: Photronics, Inc., Brookfield, CT (US)

( * ) Notice: Subject to any disclaimer, the term of this patent is extended or adjusted under 35 U.S.C. 154(b) by 127 days.

(21) Appl. No.: 09/773,122

(22) Filed: Jan. 31, 2001

(65) Prior Publication Data

US 2002/0102472 A1 Aug. 1, 2002

(51) Int. Cl.⁷ .............................. G03F 9/00; G01R 27/08
(52) U.S. Cl. ............................................ 430/5; 324/716
(58) Field of Search ................................ 430/5, 30, 322, 430/22; 324/716, 765

(56) References Cited

U.S. PATENT DOCUMENTS

| | | |
|---|---|---|
| 3,900,737 A | 8/1975 | Collier et al. |
| 4,343,877 A | 8/1982 | Chiang |
| 4,442,188 A | 4/1984 | Chiang |
| 4,656,358 A | 4/1987 | Divens et al. |
| 4,677,043 A | 6/1987 | Cordes, III et al. |
| 4,717,445 A | 1/1988 | Leung |
| 5,164,790 A | 11/1992 | McNeil et al. |
| 5,247,262 A * | 9/1993 | Cresswell et al. .......... 324/716 |
| 5,282,088 A | 1/1994 | Davidson |
| 5,637,186 A | 6/1997 | Liu et al. |
| 5,701,013 A | 12/1997 | Hsia et al. |
| 5,719,004 A | 2/1998 | Lu et al. |
| 5,726,100 A | 3/1998 | Givens |
| 5,736,863 A | 4/1998 | Liu |
| 5,766,802 A | 6/1998 | Skinner |
| 5,905,573 A | 5/1999 | Stallard et al. |
| 5,952,132 A | 9/1999 | King et al. |
| 5,962,867 A | 10/1999 | Liu |
| 5,963,329 A | 10/1999 | Conrad et al. |
| 6,000,281 A | 12/1999 | Burke |

OTHER PUBLICATIONS

Schroder, Dieter K., *Semiconductor Material and Device Characterization*, 448–506 (John Wiley & Sons, Inc. 1990).

\* cited by examiner

*Primary Examiner*—S. Rosasco
(74) *Attorney, Agent, or Firm*—Amster, Rothstein & Ebenstein

(57) ABSTRACT

A method for measuring critical dimensions on photomasks, and more specifically to a method for measuring critical dimensions on photomasks using an electrical test structure. The test structure 30 may be comprised of a cross resistor 32 for van der Pauw sheet resistance measurements, a bridge resistor 34, and a split-bridge resistor 36.

17 Claims, 4 Drawing Sheets

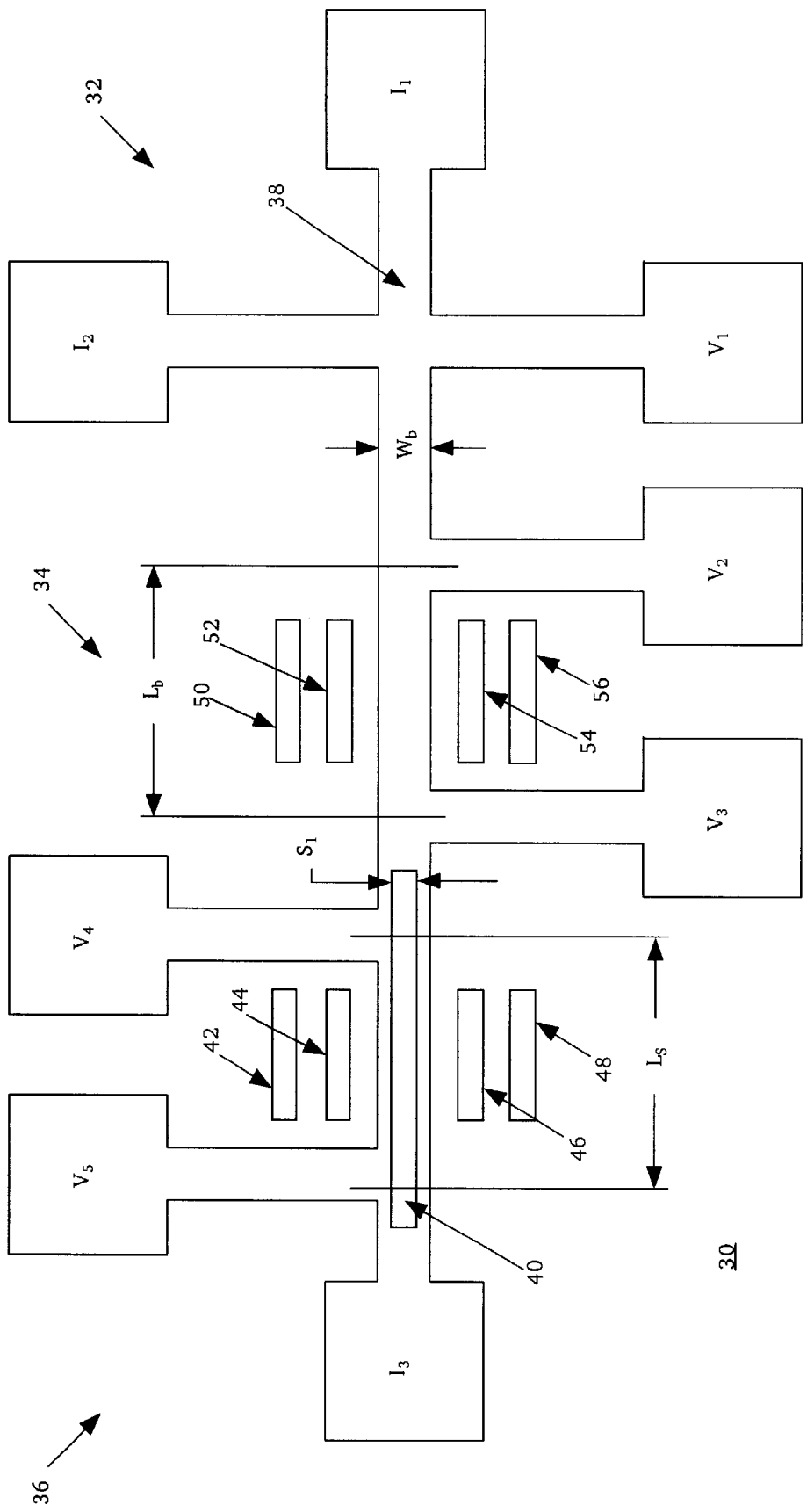
FIG. 6 Test Structure

ELECTRICAL CRITICAL DIMENSION MEASUREMENTS ON PHOTOMASKS

BACKGROUND

The present invention relates to a method for measuring critical dimensions on photomasks, and more specifically to a method for measuring critical dimensions on photomasks using an electrical test structure.

Photomasks are used in the semiconductor industry to transfer micro-scale images defining a semiconductor circuit onto a silicon or gallium arsenide substrate or wafer. The process for transferring an image from a photomask to a silicon substrate or wafer is commonly referred to as lithography or microlithography.

A typical binary photomask is comprised of a transparent quartz substrate and chrome (Cr) opaque material that includes an integral layer of chrome oxide (CrO) anti-reflective (AR) material. The pattern of the Cr opaque material and CrO AR material on the quartz substrate is a scaled negative of the image desired to be formed on the semiconductor wafer.

To create an image on a semiconductor wafer, a photomask is interposed between the semiconductor wafer, which includes a layer of photosensitive material, and an optical system. Energy generated by an energy source, commonly referred to as a Stepper, is inhibited from passing through the areas of the photomask in which the Cr opaque material and CrO AR is present. Energy from the Stepper passes through the transparent portions of the quartz substrate not covered by the Cr opaque material and the CrO AR material. The optical system projects a scaled image of the pattern of the opaque material onto the semiconductor wafer and causes a reaction in the photosensitive material on the semiconductor wafer. The solubility of the photosensistive material is changed in areas exposed to the energy. In the case of a positive photolithographic process, the exposed photosensistive material becomes soluble and can be removed. In the case of a negative photolithographic process, the exposed photosensistive material becomes insoluble and unexposed soluble photosensistive material is removed.

After the soluble photosensistive material is removed, the image or pattern formed in the insoluble photosensistive material is transferred to the substrate by a process well known in the art which is commonly referred to as etching. Once the pattern is etched onto the substrate material, the remaining resist is removed resulting in a finished product.

As described above, the image or pattern of the Cr opaque material and CrO AR material on the photomask reflects the desired image to be formed in the semiconductor wafer. It is therefore necessary that the image or pattern of the Cr opaque material and CrO AR material on the photomask be within specified tolerances. Thus, after a photomask is produced (as described below), the dimensions of the Cr opaque material and CrO AR material on the photomask are then measured to determine whether or not critical dimensions are within specified tolerances.

A photomask used in the production of semiconductor devices is formed from a "blank" or "undeveloped" photomask. As shown in FIG. 1, a prior art blank photomask 20 is comprised of four layers. The first layer 2 is a layer of quartz, commonly referred to as the substrate, and is typically approximately one quarter inch thick. Affixed to the quartz substrate 2 is a layer of Cr opaque material 4 which typically is approximately 900 Å to 1000 Å thick. An integral layer of CrO AR material 6 is formed on top of the layer of Cr opaque material 4, and is typically approximately 100 Å thick. A layer of photosensitive resist material 8 resides on top of the CrO AR material 6. The photosensitive resist material 8 is typically a hydrocarbon polymer, the various compositions and thicknesses of which are well known in the art.

The desired pattern of Cr opaque material to be created on the photomask may be defined by an electronic data file loaded into an exposure system which typically scans an electron beam (E-beam) or laser beam in a raster fashion across the blank photomask. One such example of a raster scan exposure system is described in U.S. Pat. No. 3,900,737 to Collier. As the E-beam or laser beam is scanned across the blank photomask, the exposure system directs the E-beam or laser beam at addressable locations on the photomask as defined by the electronic data file. The areas of the photosensitive resist material that are exposed to the E-beam or laser beam become soluble while the unexposed portions remain insoluble. As shown in FIG. 2, after the exposure system has scanned the desired image onto the photosensitive resist material, the soluble photosensitive resist is removed by means well known in the art, and the unexposed, insoluble photosensitive resist material 10 remains adhered to the CrO AR material 6.

As illustrated in FIG. 3, the exposed CrO AR material and the underlying Cr opaque material no longer covered by the photosensitive resist material is removed by a well known etching process, and only the portions of CrO AR material 12 and Cr opaque material 14 residing beneath the remaining photosensitive resist material 10 remain affixed to quartz substrate 2. This initial or base etching may be accomplished by either a wet-etching or dry-etching process both of which are well known in the art. In general, wet-etching process uses a liquid acid solution to erode away the exposed CrO AR material and Cr opaque material. A dry-etching process, also referred to as plasma etching, utilizes electrified gases to remove the exposed chrome oxide AR material and chrome opaque material. Dry-etching process is conducted in vacuum chamber in which gases, typically chlorine and oxygen are injected. An electrical field is created between an anode and a cathode in the vacuum chamber thereby forming a reactive gas plasma. Positive ions of the reactive gas plasma are accelerated toward the photomask which is oriented such that the surface area of the quartz substrate is perpendicular to the electrical field. The directional ion bombardment enhances the etch rate of the Cr opaque material and CrO AR material in the vertical direction but not in the horizontal direction (i.e., the etching is anisotropic or directional).

The reaction between the reactive gas plasma and the Cr opaque material and CrO AR material is a two step process. First, a reaction between the chlorine gas and exposed CrO AR material and Cr opaque material forms chrome radical species. The oxygen then reacts with the chrome radical species to create a volatile which can "boil off" thereby removing the exposed CrO AR material and the exposed Cr opaque material.

As shown in FIG. 4, after the etching process is completed the photosensitive resist material is stripped away by a process well known in the art. The dimensions of the Cr opaque material on the finished photomask are then measured to determine whether or not critical dimensions are within specified tolerances. Critical dimensions may be measured at a number of locations on the finished photomask, summed, and then divided by the number of measurements to obtain a numerical average of the critical dimensions. This obtained average is then compared to a specified target number (i.e., a mean to target comparison) to ensure compliance with predefined critical dimensions specifications. Additionally, it is desired that there is a small variance among the critical dimensions on the substrate. Accordingly, the measured critical dimensions typically must also conform to a specified uniformity requirement. Uniformity is typically defined as a range (maximum minus minimum) or a standard deviation of a population of measurements.

Additionally, as disclosed in co-pending application Ser. No. 09/409,454, the entire contents of which are incorporated by reference, a photomask may include a hardmask layer. As shown in FIG. 5, such a photomask is comprised, for example, of a quartz substrate 2, a patterned layer of opaque material 4, a patterned layer of antireflective material 6, and a patterned hardmask layer 18. The hardmask may be comprised of TiN, Ti, Si, Si3N4, doped and undoped SiO2, TiW, W, or spin-on-glass.

Prior art methods for measuring critical dimensions on photomasks utilize techniques based on optical microscopy or by using a scanning electron microscope (SEM). Both of these critical dimension measurement techniques have inherent disadvantages.

Techniques for measuring photomask critical dimensions based on optical microscopy can generally be performed relatively quickly and inexpensively and do not result in any significant charge being created on the photomask. However, these optical measurement techniques are not very accurate for small features and are not suitable for measuring features less than 0.6 µm. Additionally, the measurement of small features can be affected by other features in close proximity to the feature being measured. Further, optical measurement techniques are subject to pitch conditions and cannot be used to accurately measure certain types of photomasks such as phase shift masks (PSMs) with various optical properties.

While critical dimensions of even small features of a photomask can be measured accurately using a SEM, the use of a SEM is relatively slow and expensive process. Further, use of a SEM can result in a charge being formed on the photomask thus reducing accuracy of the measurement

SUMMARY OF INVENTION

Accordingly, it is an object of the present invention to provide a fast and accurate method of measuring the critical dimensions on a photomask.

It is a further object of the present invention to provide a method for measuring the critical dimensions of a photomask using electrical test structures.

It is still a further object of the present invention to provide a method or measuring critical dimensions of a photomask with precisions less than 5 nm and for measuring critical dimensions as small as 200 nm or less.

BRIEF DESCRIPTION OF DRAWINGS

FIG. 6 is a overhead view of a representative test structure that can be used to electrically measure representative CDs on a photomask.

DETAILED DESCRIPTION OF THE INVENTION

Figure 1:
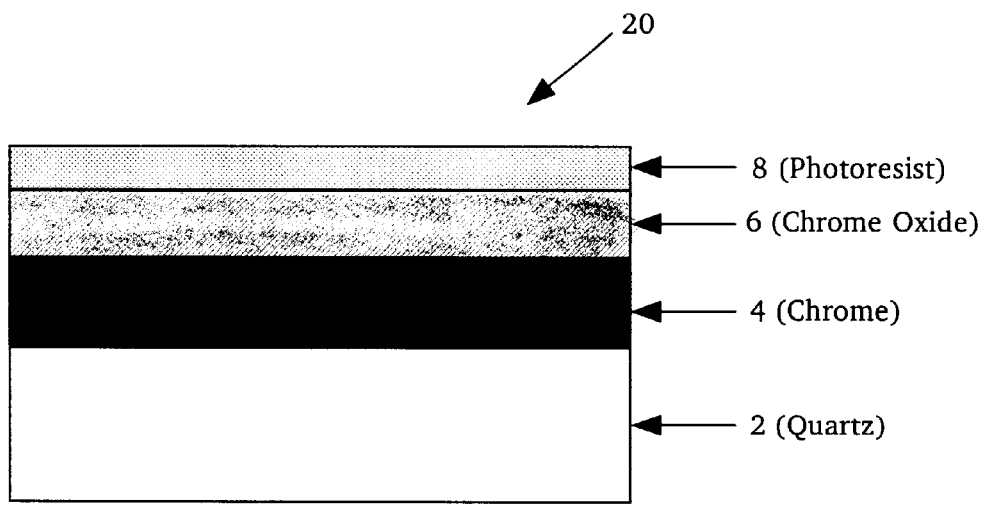
FIG. 1 is a cross-sectional view of a blank photomask illustrating the composition of the various layers of a typical prior art blank binary photomask.
Figure 2:
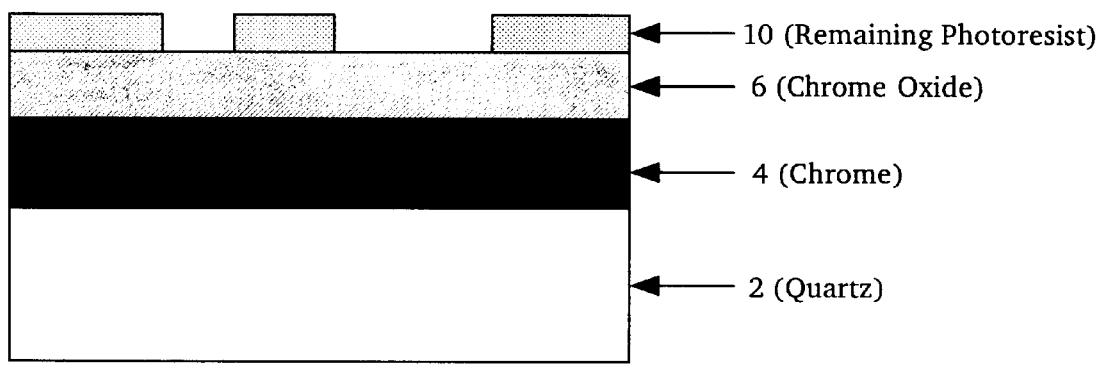
FIG. 2 is a cross-sectional view of a prior art photomask after exposure to an energy source and having the soluble photosensitive material removed.
Figure 3:
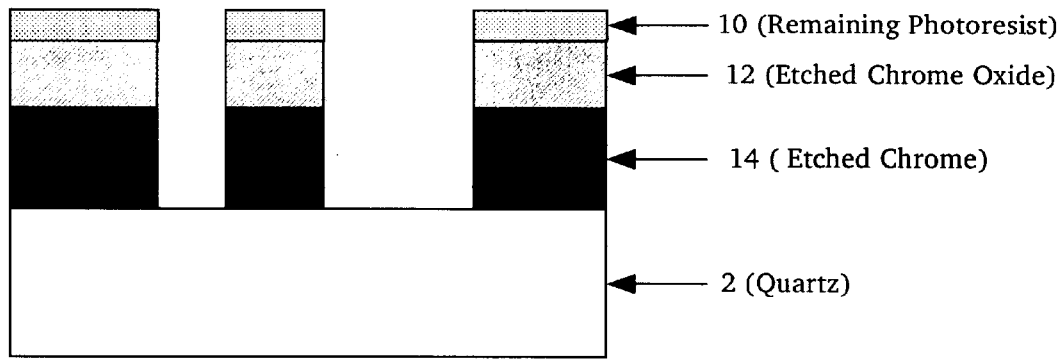
FIG. 3 is a cross-sectional view of a prior art binary photomask after being subjected to an etching process thereby removing the exposed CrO AR material and Cr opaque material.
Figure 4:
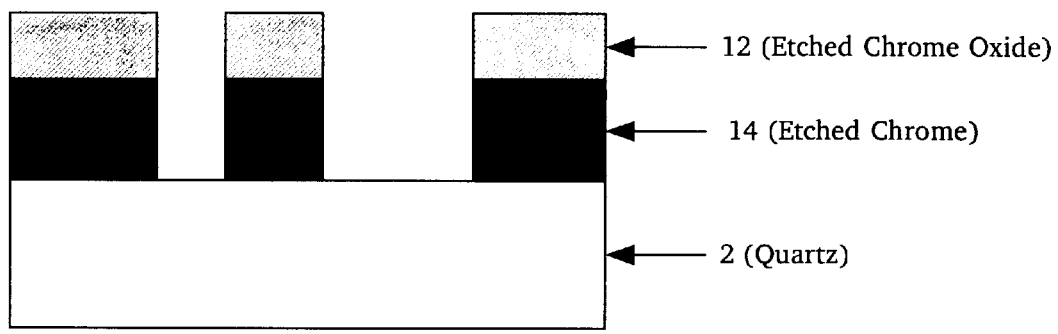
FIG. 4 is a cross-sectional view of a finished, prior art binary photomask with the photosensitive material stripped away.
Figure 5:
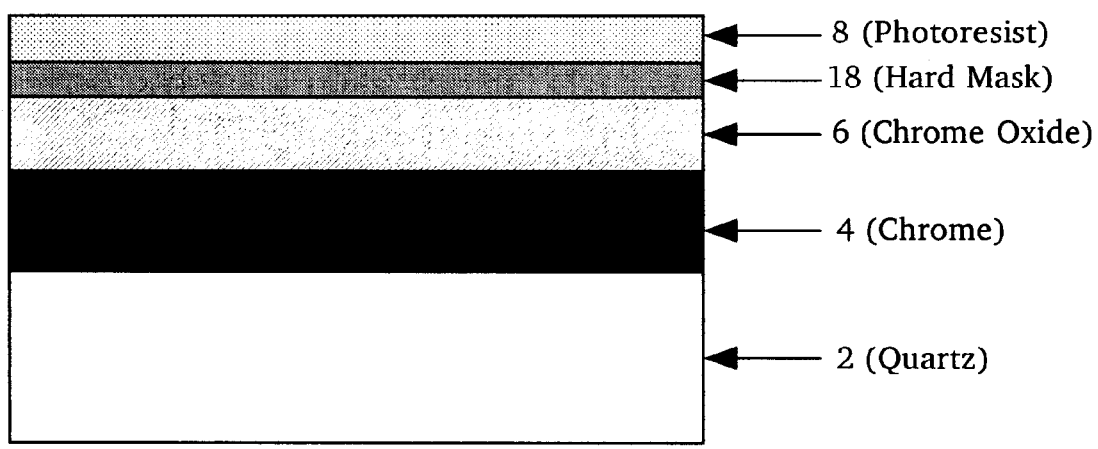
FIG. 5 is a cross-sectional view of a blank photomask including a layer of hardmask material.

The present invention utilizes test structures formed on the photomask to measure representative CDs. Using electrical means, the line widths or CDs of the test structure can be measured and compared to preestablished or baseline numbers. If the measured parameters from the test structure are within given tolerances to the baseline numbers, then the CDs of the patterned opaque material on the photomask defining the circuitry to be created on a semiconductor wafer will likewise be within predefined limits.

FIG. 6 depicts a test structure 30 used for electrically measuring critical dimensions or line widths of a finished photomask. Those skilled in the art will understand that the test structure shown in FIG. 6 is included for illustrative purposes and is not necessarily drawn to scale. The test structure 30 can be placed in any otherwise unused area of the photomask and may be replicated at a number of locations on the photomask. Additionally, the dimensions of the test structure may be varied so that different test structures formed on the photomask will have different line widths and CDs.

The test structures can be created on the photomask using the well known lithography process described. Thus, the desired patterns of the test structures can be defined by an electronic data file loaded into an exposure system which directs an E-beam or laser beam to addressable locations on the photomask as defined by the electronic data file. The areas of the photosensitive resist material that are exposed to the E-beam or laser beam become soluble while the unexposed portions remain insoluble. After the exposure system has scanned the desired image onto the photosensitive resist material, the soluble photosensitive resist is removed by means well known in the art, and the unexposed, insoluble photosensitive resist material remains adhered to the CrO AR material.

The exposed CrO AR material and the underlying Cr opaque material no longer covered by the photosensitive resist material are subsequently removed by a well known etching process such that only the portions of CrO AR material and Cr opaque material residing beneath the remaining photosensitive resist material remain affixed to quartz substrate. As set forth above, this initial or base etching may be accomplished by either a wet-etching or dry-etching process both of which are well known in the art.

After the etching process is completed, the remaining photosensitive resist material is stripped away by a process well known in the art leaving the test structure 30 comprised of a layer of CrO AR material and a layer of Cr opaque material. Additionally, as set forth in co-pending U.S. patent application Ser. No. 09/409,454, the entire contents of which are incorporated by reference, the photomask may include a hardmask layer comprised of TiN, Ti, Si, TiW, or W.

As shown in FIG. 6, the test structure 30 is comprised of a cross resistor 32 for van der Pauw sheet resistance measurements, a bridge resistor 34, and a split-bridge resistor 36. The test structure 30 also includes a number of test pads extending from image line 38 having a width $W_b$, typically between 500 nm to 2000 nm. Test pads $V_1$, $V_2$, $V_3$, $V_4$, and $V_5$ are used to receive probes so that voltage levels between different points in the test structure can be measured. Likewise, test pads $I_1$, $I_2$, and $I_3$ are used to receive probes so that current levels can be injected into various points of the test structure. The center lines of test pads $V_5$ and $V_4$ are spaced apart by a distance of $L_5$, and the center lines of test pads $V_3$ and $V_2$ are spaced apart by a distance $L_b$.

The split bridge resistor portion 36 of the test structure 30 also includes a space 40 in image line 38 having a width $S_1$ and extending from approximately the left most edge of test pad $V_5$ to the right most edge of test pad $V_4$. In the preferred embodiment, space 40 is positioned a distance of W (not shown) from the upper and lower edges of image line 38. The split bridge resistor portion 36 of the test structure 30 may also include a plurality of substantially parallel image lines or scattering bars 42, 44, 46, and 48 having a length of approximately 5 to 10 microns and a width $W_2$ (not shown) of approximately 500 nm to 2000 nm. As shown in FIG. 6, scattering bars 42 and 44, spaced approximately 250 nm to 2000 nm apart, are located between test pads $V_5$ and $V_4$ at a distance $S_3$ (not shown) of approximately 500 nm to 2000 nm above image line 38. Likewise, scattering bars 46 and 48, spaced approximately 500 nm to 2000 nm apart, are located between test pads $V_5$ and $V_4$ at distance $S_3$ below image line 38.

The bridge resistor portion 34 of test pattern also includes a plurality of substantially parallel image lines or scattering bars 50, 52, 54, and 56 having a length of approximately 5 to 10 microns and a width $W_1$ (not shown) of approximately 250 nm to 2000 nm. As shown in FIG. 6, scattering bars 50 and 52, spaced approximately 500 nm to 2000 nm apart, are located between test pads $V_3$ and $V_2$ at a distance $S_2$ (not shown) of approximately 500 nm to 2000 nm above image line 38. Scattering bars 54 and 56, also spaced approximately 500 nm to 2000 nm apart, are located between test pads $V_3$ and $V_2$ at distance $S_2$ below image line 38. By varying of dimensions of $W_1$, $W_2$, $S_2$ and $S_3$, the feature proximity effects on critical dimensions W and $W_b$ can be examined.

The cross resistor section 32 of test structure 30 is used to ascertain the sheet resistance ($\rho_s$) as defined by the equation: $\rho_s=(\pi/\ln 2)\times(V_{12}/I_{12})$, where $V_{12}$ is the difference in the potential at pads $V_1$ and $V_2$, and $I_{12}$ is the current flowing from pad $I_2$ to pad $I_1$. Constant current source may be used to inject a fixed amount of electrical current through the $I_1$, $I_2$, and $I_3$ pads. The voltage potential drop across image line 38 can be measured using a voltmeter on the $V_1$ and $V_2$ pads.

Similarly, the bridge resistor portion 34 of test structure 30 is used to ascertain the width $W_b$ of image line 38 as defined by the equation: $W_b=\rho_s L_b I_{13}/V_{23}$, where $V_{23}$ is the difference in the potential at pads $V_2$ and $V_3$ and $I_{13}$ is the current flowing from pad $I_3$ to pad $I_1$ and $\rho_s$ is the sheet resistance obtained from the cross resistor section 32.

After the width $W_b$ is electrically measured, the measured value is compared with a predetermined baseline value to determine whether or not the measured value is within predetermined limits or tolerances.

The split-bridge resistor portion 36 of test pattern is used to ascertain the variable $W_s$ (i.e., the total line width at the split bridge area) as given by the equation: $W_s=2W=\rho_s L_s I_{13}/V_{45}$ where $\rho_s$ is the sheet resistance obtained from the cross resistor section 32, $L_s$ is the distance between test pads $V_4$ and $V_5$, $I_{13}$ is the current between test pads $I_1$ and $I_3$, and $V_{45}$ is the difference between test pads $V_4$ and $V_5$.

From the above measurements, the width $S_1$ of space 40 can be ascertained as given by the equation $S_1=W_b-W_s=\rho_s\times[(L_b V_{45}-L_s V_{23})\times I_{13}/V_{23}V_{45}]$. Here again, the measured value of space 40 is compared to a predetermined value to determine whether or not the measured value is within predetermined limits or tolerances.

As described above, test pattern 30 can be placed in any otherwise unused portion of the photomask and can be replicated in a number of locations on the photomask. Further, if multiple test patterns are included on the photomask, the dimensions of the test structures can be varied. Accordingly, the spirit and scope of the present invention is to be construed broadly and limited only by the appended claims, and not by the foregoing specification.

What is claimed is:

1. A photomask comprised of a substantially transparent substrate and a first area of patterned opaque material defining an image to be formed on a semiconductor wafer and a second patterned area of opaque material comprising a test structure for electrically measuring representative critical dimensions, said test structure comprising:

(a) a cross resistor structure connected to said image line, (b) a bridge resistor structure connected to said image line, (c) a split-bridge resistor structure connected to said image line, and (d) a plurality of substantially parallel scattering bars separated from said image line.

2. The photomask of claim 1 wherein said plurality of substantially parallel scattering bars is comprised of two substantially parallel scattering bars having a length of approximately 5 to 10 microns and a width of approximately 250 to 2000 nm located above said image line and two substantially parallel scattering bars having a length of approximately 5 to 10 microns and a width of approximately 500 to 2000 nm located below said image line.

3. The photomask of claim 1 wherein said plurality of substantially parallel scattering bars is comprised of four substantially parallel scattering bars having a length of approximately 5 to 10 microns and a width of approximately 250 to 2000 nm located above said image line and four substantially parallel scattering bars having a length of approximately 5 to 10 microns and a width of approximately 500 to 2000 nm located below said image line.

4. The photomask of claim 1 wherein said first area of patterned opaque material and a second patterned area of opaque material further include a layer of hardmask material.

5. The photomask of claim 1 wherein the image line includes a space having a width dimension wherein said width dimension can be ascertained by the equation $\rho_s\times[(L_b V_{45}-L_s V_{23})\times I_{13}/V_{23}V_{45}]$.

6. The photomask of claim 1, wherein said cross resistor structure is used to perform van der Pauw sheet resistance measurements.

7. The photomask of claim 1, wherein said plurality of substantially parallel scattering bars is located proximate to said bridge resistor structure.

8. The photomask of claim 7, wherein said plurality of substantially parallel scattering bars is comprised of two substantially parallel scattering bars having a length of approximately 5 to 10 microns and a width of approximately 250 to 2000 nm located above said image line and two substantially parallel scattering bars having a length of approximately 5 to 10 microns and a width of approximately 500 to 2000 nm located below said image line.

9. The photomask of claim 1, wherein said plurality of substantially parallel scattering bars is located proximate to said split-bridge resistor structure.

10. The photomask of claim 9, wherein said plurality of substantially parallel scattering bars is comprised of two substantially parallel scattering bars having a length of approximately 5 to 10 microns and a width of approximately 250 to 2000 nm located above said image line and two substantially parallel scattering bars having a length of approximately 5 to 10 microns and a width of approximately 500 to 2000 nm located below said image line.

11. A test structure of opaque material for measuring the line width of an image line created on a photomask, said test structure comprising:

(a) a cross resistor associated with said image line, (b) a bridge resistor associated with said image line, (c) a split-bridge resistor associated with said image line, and (d) a plurality of substantially parallel scattering bars separated from said image line.

12. The test structure of claim 11, wherein said plurality of substantially parallel scattering bars is located proximate to said bridge resistor.

13. The test structure of claim 12, wherein said plurality of substantially parallel scattering bars is comprised of two substantially parallel scattering bars having a length of approximately 5 to 10 microns and a width of approximately 250 to 2000 nm located above said image line and two substantially parallel scattering bars having a length of approximately 5 to 10 microns and a width of approximately 500 to 2000 nm located below said image line.

14. The test structure of claim 11, wherein said plurality of substantially parallel scattering bars is located proximate to said split-bridge resistor.

15. The test structure of claim 14, wherein said plurality of substantially parallel scattering bars is comprised of two substantially parallel scattering bars having a length of approximately 5 to 10 microns and a width of approximately 250 to 2000 nm located above said image line and two substantially parallel scattering bars having a length of approximately 5 to 10 microns and a width of approximately 500 to 2000 nm located below said image line.

16. The test structure of claim 11, wherein said photomask further includes a layer of hardmask material.

17. The test structure of claim 11, wherein said cross resistor is used to perform van der Pauw sheet resistance measurements.

* * * * *